(12) United States Patent
Bakalski

(10) Patent No.: US 10,374,595 B1
(45) Date of Patent: Aug. 6, 2019

(54) SELF-ADJUSTABLE RF SWITCH CELL

(71) Applicant: Infineon Technologies AG, Neubiberg (DE)

(72) Inventor: Winfried Bakalski, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/876,972

(22) Filed: Jan. 22, 2018

(51) Int. Cl.
H03K 17/16 (2006.01)

(52) U.S. Cl.
CPC ..... H03K 17/16 (2013.01); H03K 2217/9401 (2013.01)

(58) Field of Classification Search
CPC ..... H01L 27/00; H01L 27/0218; H03K 17/00; H03K 17/16; H03K 17/162; H03K 17/6872; H03K 17/6874; H03K 19/00; H03K 19/00361; H03K 2217/00; H03K 2217/9401
USPC .......................................................... 327/382
See application file for complete search history.

(56) References Cited

U.S. PATENT DOCUMENTS

| | | | | |
|---|---|---|---|---|
| 5,999,461 A | * | 12/1999 | Verhaeghe | G11C 8/08 365/189.09 |
| 2009/0181630 A1 | | 7/2009 | Seshita et al. | |
| 2010/0073066 A1 | * | 3/2010 | Seshita | H03K 17/693 327/427 |
| 2011/0294445 A1 | | 12/2011 | Goto et al. | |
| 2011/0316062 A1 | | 12/2011 | Kondo et al. | |
| 2014/0266415 A1 | * | 9/2014 | Kerr | H03H 11/1213 327/552 |
| 2015/0303982 A1 | | 10/2015 | Yang et al. | |
| 2017/0272066 A1 | * | 9/2017 | Scott | H03K 17/04123 |
| 2017/0373680 A1 | | 12/2017 | Bakalski | |

OTHER PUBLICATIONS

Zhu, Yu et al., "High Voltage SOI Stacked Switch with Varying Periphery FETs," IEEE Asia-Pacific Microwave Conference (APMC), Dec. 6-9, 2015, 3 pages.

* cited by examiner

Primary Examiner — Lincoln D Donovan
Assistant Examiner — Dave Mattison
(74) Attorney, Agent, or Firm — Slater Matsil, LLP

(57) ABSTRACT

An RF switch includes two or more coupled RF switch cells, each RF switch cell including a transistor having a first source/drain node, a second source/drain node, and a gate node, a first varactor is coupled between the first source/drain node and the gate node, and a second varactor is coupled between the second source/drain node and the gate node.

20 Claims, 5 Drawing Sheets

SELF-ADJUSTABLE RF SWITCH CELL

TECHNICAL FIELD

The present invention relates generally to a circuit and method for a self-adjustable RF switch cell.

BACKGROUND

RF switches are used in a variety of RF circuits to implement various functions in various applications. For instance, one application is a high voltage application. Multiple RF cells are typically coupled together so that any individual RF cell must only withstand a lower voltage that is a fraction of the high voltage and is thus within the breakdown voltage limits for the transistor manufacturing process used. While the use of multiple RF cells ideally evenly distributes the high voltage equally into low voltage portions across the individual RF cells, in practice the distribution of the high voltage can be unequal due to parasitic elements and effects. Linearity and other performance characteristics of the high voltage RF switch using multiple RF cells can thus be affected.

SUMMARY

In an embodiment, a self-adjustable RF switch cell comprises a transistor comprising a first current node, a second current node, and a control node; a first circuit having a voltage-adjustable capacitive element coupled between the first current node and the control node; and a second circuit having a voltage-adjustable capacitive element matched to the first circuit coupled between the second current node and the control node, wherein the first and second circuits are configured for maintaining an operating condition of the self-adjustable RF switch cell independently of substrate parasitic elements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

RF switches having a plurality of coupled RF switch cells are sometimes realized using a bulk CMOS technology, which uses a biased substrate. The transistors used in the RF switch circuit can have a parasitic substrate capacitance and a parasitic resistance coupled between the source of the transistor and ground, and between the drain of the transistor and ground. The voltage at the source and the drain of the transistor thus causes a corresponding parasitic current to flow between the transistor source and drain, and ground. These parasitic elements and effects cause a high voltage impressed across a plurality of coupled RF switch cells to be unequally distributed amongst the individual RF switch cells, with a corresponding degradation of the linearity of the switch as well as a degradation of other performance characteristics. For example, a first RF cell in a plurality of coupled RF cells nearest to the RF source may have a maximum fraction of the high voltage RF input signal; whereas a last RF cell in a plurality of coupled RF cells furthest from the RF source and coupled to ground may have a minimum fraction of the high voltage RF input signal. Ideally, each RF cell in the plurality of coupled RF cells would all have the same fraction of the high voltage RF input voltage for maximum linearity and circuit performance.

According to embodiments, a tunable capacitance is added into each RF switch cell in an RF switch circuit that is self-adjusted by leakage currents such as GIDL (Gate Induced Drain Leakage) leakage referred to above. The tunable capacitance inside of the switch cell uses an RF switch device operated as a varactor between the drain and gate of the cell transistor and another varactor placed between the source and gate of the cell transistor.

Figure 1A:
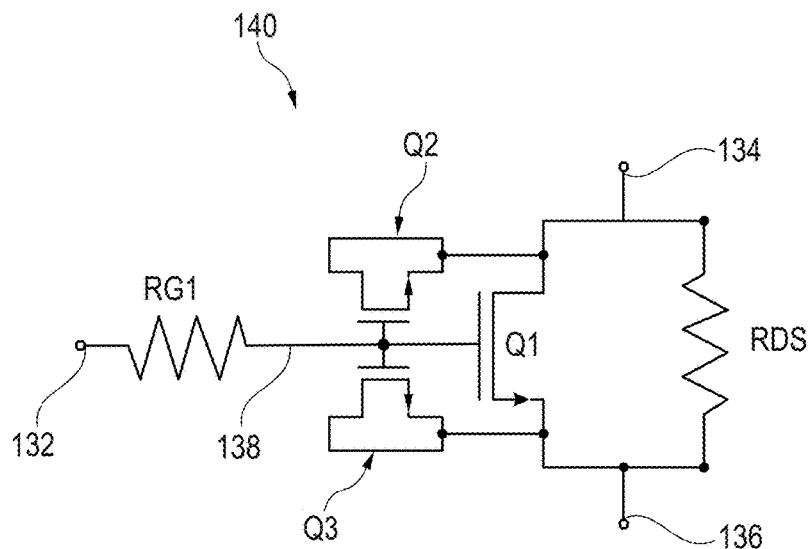
FIG. 1A is a schematic diagram of an RF cell suitable for use in an RF switch according to an embodiment.

FIG. 1A is a schematic diagram of an RF cell 140 suitable for use in an RF switch such as a high voltage switch having a plurality of coupled switches. RF cell 140 includes a cell transistor Q1 having a drain coupled to node 134, which can be a signal node coupled to a previous cell (not shown in FIG. 1A). Transistor Q1 has a source coupled to node 136, which can be a signal node coupled to a subsequent cell (not shown in FIG. 1A). Transistor Q1 has a gate that is coupled to node 138. Also shown is a capacitor-connected transistor Q2 that operates as a varactor having a gate coupled to node 138, and a source/drain coupled to node 134. A capacitor-connected transistor Q3 that operates as a varactor has a gate coupled to node 138, and a source/drain coupled to node 136. RF cell also includes a gate resistor RG1 coupled between nodes 132 and 138, and a source/drain resistor RDS coupled between nodes 134 and 136.

RF switch cell 140 adapts the "off" capacitance of transistor Q1 ("Coff") automatically, so that the RF stack including the plurality of individual RF switch cells 140 is symmetrized with respect to signal voltage. In other words, the action of the varactors Q2 and Q3 in the RF switch cell uses the unequally distributed input voltage (due to the above discussed parasitic effects) to establish a more equal distribution of the input voltage. However the varactors Q2 and Q3 need the voltage "information" that high RF voltage swing is present to perform the self-adjustment.

The parasitic GIDL can be used to provide the necessary voltage information to the RF cell 140 as is described in further detail below. Having a negatively biased transistor bulk, a high RF voltage swing causes the source/drain nodes of transistor Q1 to charge up negatively. If the source and drain nodes 134 and 136 of transistor Q1 are charged up, the bias voltage across varactors Q2 and Q3 goes down to nearly zero volts. In one example of an OFF condition, nodes 132 and 138 will all be at the same voltage, e.g. −2.5 volts, but nodes 134 and 136 are at zero volts, so that Vgs and Vgd of transistor Q1 are biased negatively. A leakage current from the substrate would cause nodes 134 and 136 to charge up negatively to e.g. −1.0 volts to −2.5 volts, depending on the RDS resistors values and the RF voltage swing.

Figure 1B:
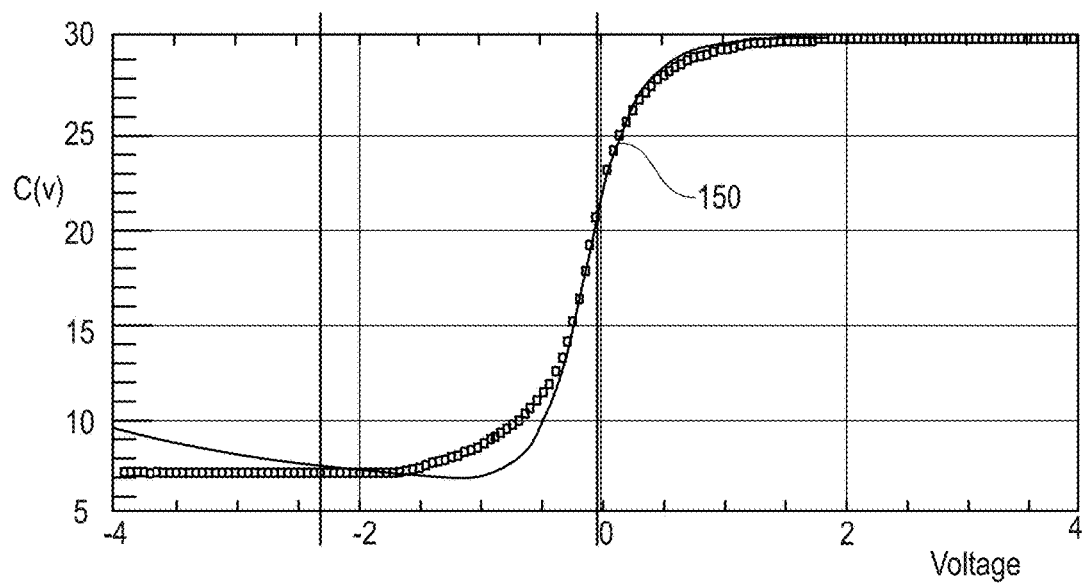
FIG. 1B is a plot of capacitance versus voltage for the varactors used in the RF cell of FIG. 1A.

An example varactor curve 150 is shown in FIG. 1B. The capacitance C(V) is plotted versus the voltage across the varactor. As can be seen, the capacitance at, for example, zero volts is much higher than the capacitance at a negative bias voltage. The units of capacitance and voltage can vary with the process used for forming the varactor. Even within a given process, the varactor capacitance can vary with the width-to-length ratio (W/L) of the transistor used to form the varactor.

Thus, as soon as the high RF voltage is impressed across the RF transistor Q1, a GIDL leakage current causes a negative charging of the drain and source nodes 134 and 136, and hence capacitance of the varactors Q2 and Q3 is strongly increased. Transistor Q1 starts to self-protect by the increase of capacitance in varactors Q2 and Q3 and correspondingly adapts inside of a stack to the local RF voltage. The effect described above is more or less pronounced depending upon the relative voltage across an individual RF cell.

It is important to note that the mechanism of an embodiment of RF cell 140 is as follows: cells experiencing a higher portion (with respect to the ideal equal portion) of the RF input signal will self-adjust to have higher varactor capacitance, which will in turn self-adjust the voltage across the RF cell to be smaller, and cells experiencing a smaller portion (with respect to the ideal equal portion) of the RF input signal will self-adjust to a smaller varactor capacitance, which will in turn self-adjust the voltage across the RF cell to be larger. In both cases a more equal distribution of the RF input signal voltage will be realized. A further description of this process is set forth below with respect to FIG. 6.

In the ESD case, where the bulk/body voltage of transistor Q1 is zero volts, the capacitance is strongly increased, causing a low Z (impedance) value to be present in an ESD (Human Body Model—HBM) incident. This self-adjustment mechanism therefore has a positive ESD protection effect in addition to the other performance features described herein.

Figure 1C:
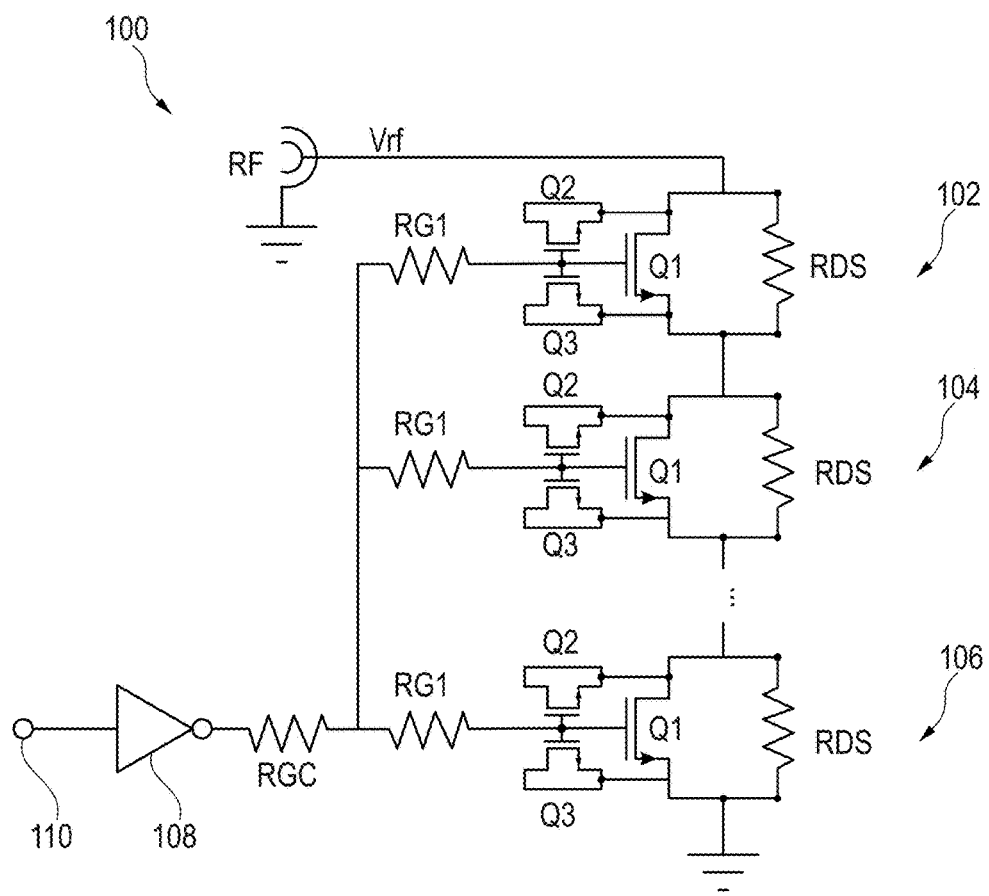
FIGS. 1C, 2, 4, 5 and 6 are schematic diagrams of shunt implementations of an RF switch including two or more coupled RF cells according to embodiments.

A corresponding RF stack 100 (RF switch circuit) is shown in FIG. 1C, including serially-coupled RF cells 102, 104, and 106. A first RF cell 102 is coupled to the RF signal input and experiences the largest portion of the input voltage in an uncorrected RF cell. A last RF cell 106 is coupled to ground and would experience the smallest portion of the input voltage in an uncorrected RF cell. RF stack 100 also includes an input switch signal node 110 for energizing driver 108. The output of driver 108 is coupled to a common gate resistor RGC, which is in turn coupled to the individual gate resistors RG1 of each of the RF cells.

Figure 2:
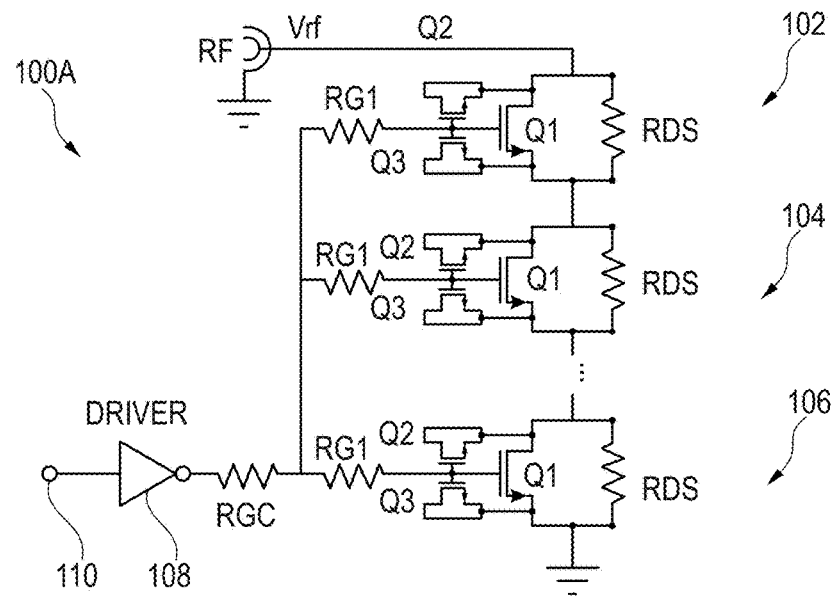

However, the RF switch 100 shown worsens (increases) the total OFF capacitance, due to the minimum capacitance of each of the varactors. Therefore, a weighting of the W/L of the varactors is used to allow a more even distribution of the input signal voltage across the individual RF cells. For a given width W, the length of each of the varactors is changed as shown in FIG. 2. For example, RF cell 102 uses varactors Q2 and Q3 that have a transistor length of 15 μm, RF cell 104 uses varactors Q2 and Q3 that have a transistor length of 13 μm. The gradual diminishing of the transistor length is continued until a last RF cell 106 uses varactor Q2 and Q3 that have a transistor length of 1 μm. A linear weighting is shown in FIG. 2, in that a maximum transistor length of 15 μm in RF cell 102 is shown closest to the RF source, while a minimum transistor length of 1 μm in RF cell 106 closest to ground is shown, and the decrement of transistors lengths is made in equal portions of 2 μm between RF cells. An alternative quadratic weighting can be made in which a relatively larger decrement of transistor lengths can be made in the RF cells closer to the RF source and a gradually smaller diminishing decrement of transistor lengths can be made in the RF cells closer to ground. Other weightings can also be used. The choice of which weighting to use depends upon the exact manufacturing process used, and the application, as well as the level of accuracy and linearity of the switch that is required. In many applications, the linear weighting will be sufficient.

Figure 3:
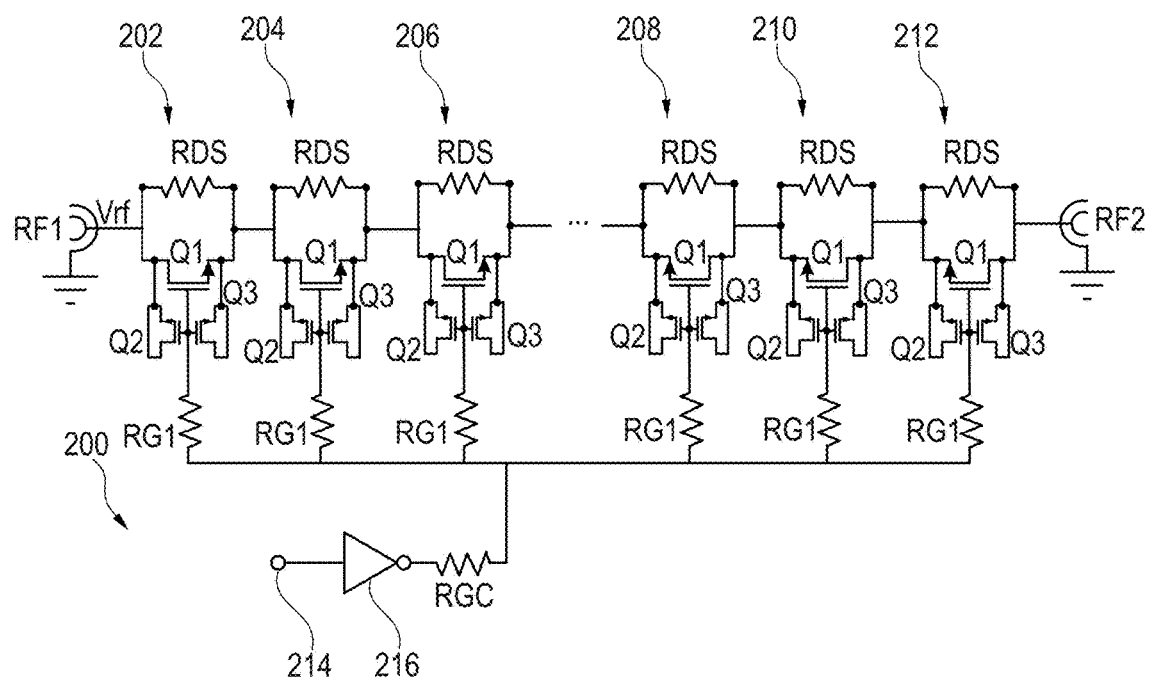
FIG. 3 is a schematic diagram of a series implementation of an RF switch including two or more coupled RF cells according to an embodiment.

Embodiments using the self-adjusting RF cell can also be made that allow a series mode switch, as it adapts automatically to the voltage distribution. In series mode (as opposed to the previously described shunt mode) such an RF switch embodiment is shown in FIG. 3. RF switch 200 shows a plurality of RF cells 202, 204, 206, 208, 210, and 212 as previously described coupled between a first RF source RF1 and a second RF source RF2. Any number of RF cells can be used. A driver 216 is coupled between input node 214 and a common gate resistor RGC as shown. In turn, the common gate resistor RGC is coupled to the individual gate resistors RG1 of each of the RF cells. The RF cells 202 and 212 closest to the respective RF signal inputs RF1 and RF2 have the longest transistor lengths (15 μm) and largest capacitance. RF cells 204 and 210 have a transistor length of 13 μm. RF cells 206 and 208 have a transistor length of 11 μm. The transistor lengths are decreased until a minimum transistor length (and minimum capacitance) is found with a transistor cell at the midpoint of the RF cell chain shown in FIG. 3. A linear weighting is used in switch 200 of FIG. 3 as a constant transistor length decrement of 2 μm is used. The quadratic weighting previously described or other weightings can also be used in the manner described above for switch 200.

Figure 4:
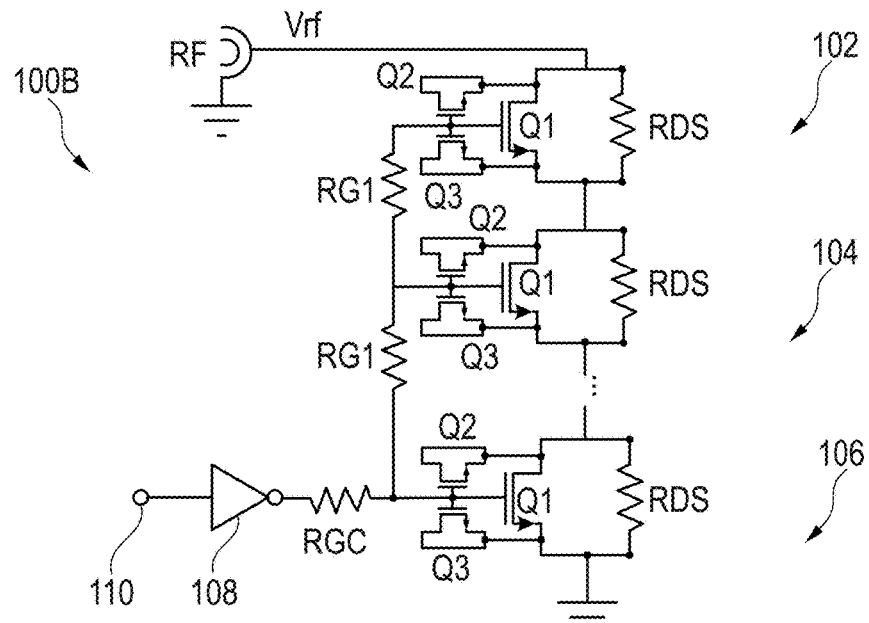

A Gate-Resistor-Gate Bias embodiment 100B as shown in FIG. 4 allows the RF switch to overcome the thermal stress (experienced with increasing RF source strength) on the poly-resistors used to form the gate resistors. In FIG. 4, the gate resistors RG1 are coupled between the input (gate) of each cell 102, 104, and 106, instead of being coupled to a common gate resistor RGC in the configuration shown in FIG. 1C. The thermal stress is overcome by enlarging the gate resistors RG1 or by using a higher resistance value (which may affect switching time).

It is important to note, that the charging of the drain-source nodes of the RF transistor cells is strongly dependent on the dimension of the drain-to-source resistor RDS. The lower ohmic resistor RDS is, the less charge-up occurs. Hence the varactors Q2 and Q3 can become less efficient.

Figure 5:
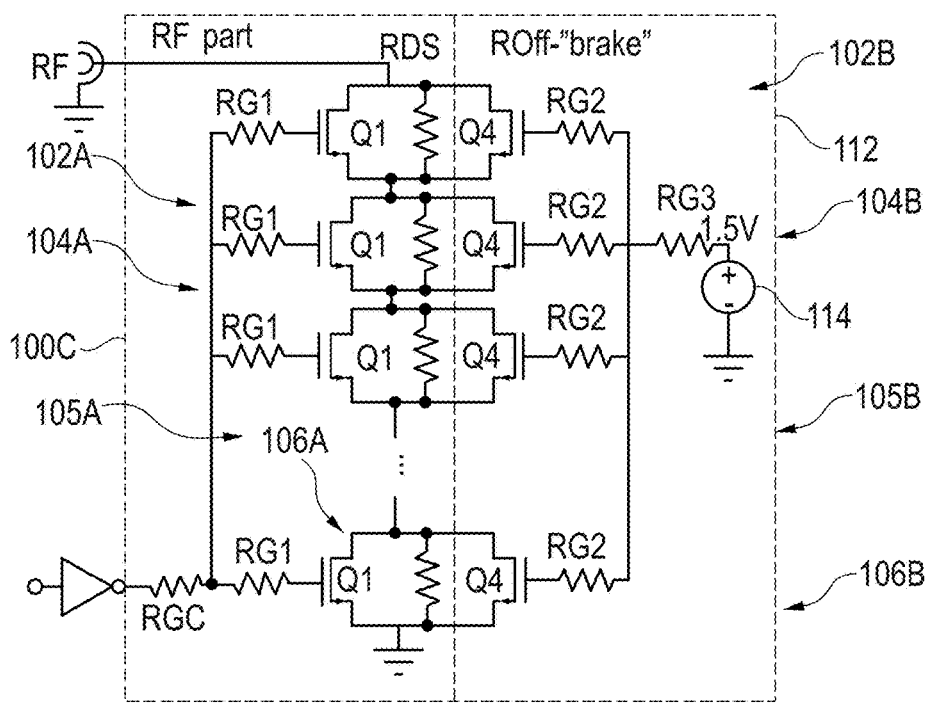

In some cases, it is an advantage to make the RDS resistors adaptive as well. As shown in FIG. 5, resistors RDS can be replaced by or supplemented with "lossy", high Ron switch transistors Q4. A high gate length (10 μm for example) and a low width can be used for transistors Q4. If each transistor Q4 is biased at the gate, the gate voltage can be used to adjust the value of RDS. RF switch 100C includes an RF switch portion substantially as previously described including RF cells 102A, 104A, 105A, and 106A, as well as individual gate resistors RG1, a common gate resistor RGC, and a driver. RF switch 100C also includes an Roff-"brake" portion 112 including brake cells 102B, 104B, 105B, and 106B. Each brake cell includes a transistor Q4 and a gate resistor RG2. The gate resistors RG2 are coupled together at a common node, which is coupled to a first end of resistor RG3. The other end of resistor RG3 is coupled to a source of constant bias voltage 114. In an embodiment, constant bias voltage 114 is set to 1.5 volts.

Similar to the previously described varactors, the RDS resistor value can be also made to be self-adjusting, so that charging of the source and drain nodes causes an automatic reduction of RDS values. This automatic reduction in the RDS value can be used to compensate temperature effects that change the varactors' C(V) curve. The RDS value change is proportional to the adjusted gate voltage, so that in practice a factor of two to three in RDS value change can be achieved.

Figure 6:
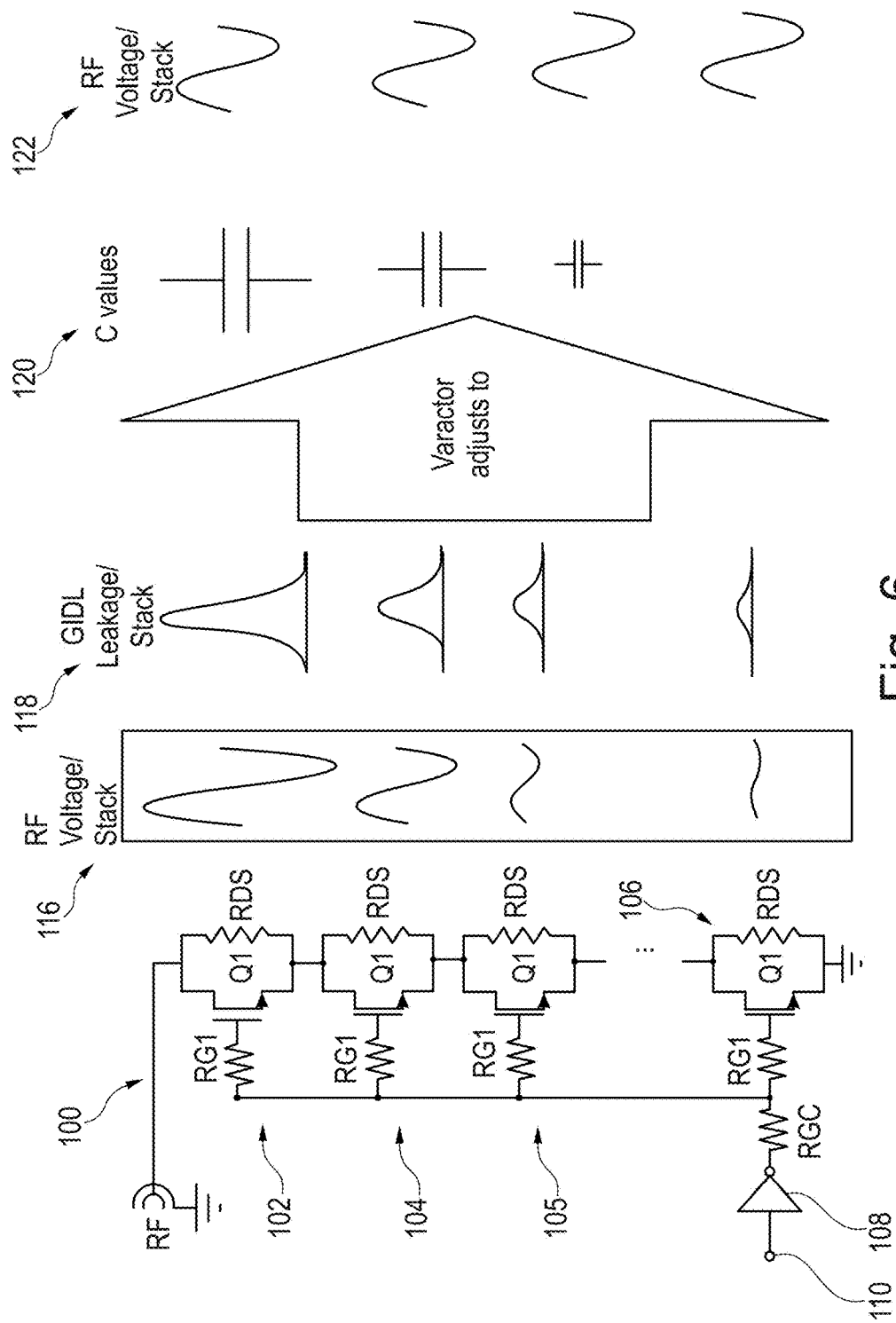

As previously described, using the weighted varactors can symmetrize the RF stack, before high GIDL or leakage levels occur. This is shown in FIG. 6. FIG. 6 shows the shunt RF stack 100 previously described including an RF source, RF cells 102, 104, 105, and 106, as well as driver 108 and input 110. The voltage 116 across each of the cells is shown, wherein a first RF cell 102 has a disproportionately large voltage, and wherein a last RF cell 106 has a disproportionately small voltage. Intermediate RF cells 104 and 105 have corresponding intermediate sized RF voltages 116 as shown. The corresponding leakage current 118 for each RF cell is shown, wherein the first RF cell 102 has the highest leakage current, and the last RF cell 106 has the least leakage current. Correspondingly, the first RF cell 102 has the highest capacitance value 120 due to the most capacitive adjustment by the cell varactors. The last RF cell 106 has the smallest capacitance value 120 due to the least capacitive adjustment by the cell varactors. The final RF voltage 122 is shown as being substantially equal once the internal cell adjustments are automatically performed according to embodiments.

In a first embodiment, a self-adjustable RF switch cell comprises a transistor comprising a first current node, a second current node, and a control node; a first circuit having a voltage-adjustable capacitive element coupled between the first current node and the control node; and a second circuit having a voltage-adjustable capacitive element matched to the first circuit coupled between the second current node and the control node, wherein the first and second circuits are configured for maintaining an operating condition of the self-adjustable RF switch cell independently of substrate parasitic elements. The substrate parasitic elements include at least one of a parasitic current, resistance, or capacitance. The first circuit and the second circuit each comprise a varactor, or a capacitor-connected transistor. The self-adjustable RF switch cell can further comprise a resistor coupled between the first current node and the second current node, as well as an additional transistor having a current path coupled between the first current node and the second current node and an additional control node coupled to a constant voltage source.

In a second embodiment, an RF switch comprises a plurality of series-coupled RF switch cells, at least one of the RF switch cells comprising a transistor comprising a first current node, a second current node, and a control node; a first varactor coupled between the first current node and the control node; and a second varactor coupled between the second current node and the control node. The transistor of the at least one of the RF switch cells comprises a first n-channel transistor having a collector coupled to the first current node, a source coupled to the second current node, and a gate coupled to the control node. The first varactor of the at least one of the RF switch cells comprises a second n-channel transistor having a collector coupled to the first current node, a source coupled to the first current node, and a gate coupled to the control node. The second varactor of the at least one of the RF switch cells comprises a third n-channel transistor having a collector coupled to the second current node, a source coupled to the second current node, and a gate coupled to the control node. At least one of the RF switch cells further comprises a resistor coupled between the first current node and the second current node. At least one of the RF switch cells further comprises a fourth n-channel transistor having a collector coupled to the first current node, a source coupled to the second current node, and a gate coupled to a constant voltage source. In the RF switch, a first switch cell is coupled to an RF voltage source and a last switch cell is coupled to ground. The first RF switch cell can be coupled to a first RF voltage source and the last RF switch cell can be coupled to a second RF voltage source. The transistor of a first RF switch cell has a first channel length, and the transistor of a second switch cell has a second channel length different from the first channel length. The first control node of an Nth RF switch cell is coupled to the second control node of an (N−1)th RF switch cell, and the second control node of the Nth RF switch cell is coupled to the first control node of an (N+1)th RF switch cell. In the RF switch, a driver is coupled to the control node of each of the series coupled RF switch cells.

In a third embodiment, a method of operating an RF switch comprising a plurality of RF switch cells, at least one of the switch cells including a transistor, comprises adjusting a first capacitor coupled between a first current node of the transistor and a control node of the transistor according to a voltage across the at least one of the RF switch cells; and adjusting a second capacitor coupled between a second current node of the transistor and the control node of the transistor according to the voltage across the at least one of the RF switch cells. The method can further include adjusting a resistor coupled between the first current node and the second current node of the at least one of the RF switch cells, wherein adjusting the resistor comprises adjusting the resistor according to the voltage across the at least one of the RF switch cells.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A self-adjustable RF switch cell comprising:
   a transistor comprising a first current node, a second current node, and a control node;
   a first circuit having a voltage-adjustable capacitive element coupled between the first current node and the control node; and
   a second circuit having a voltage-adjustable capacitive element matched to the first circuit coupled between the second current node and the control node,
   wherein the first and second circuits are configured for maintaining an operating condition of the self-adjustable RF switch cell independently of substrate parasitic elements.

2. The self-adjustable RF switch cell of claim 1, wherein the substrate parasitic elements include at least one of a parasitic current, resistance, or capacitance.

3. The self-adjustable RF switch cell of claim 1, wherein the first circuit and the second circuit each comprise a varactor.

4. The self-adjustable RF switch cell of claim 1, wherein the first circuit and the second circuit each comprise a capacitor-connected transistor.

5. The self-adjustable RF switch cell of claim 1, further comprising a resistor coupled between the first current node and the second current node.

6. The self-adjustable RF switch cell of claim 1, further comprising an additional transistor having a current path coupled between the first current node and the second current node and an additional control node coupled to a constant voltage source.

7. An RF switch comprising:
a plurality of series-coupled RF switch cells, at least one of the RF switch cells comprising:
a transistor comprising a first current node, a second current node, and a control node;
a first varactor coupled between the first current node and the control node; and
a second varactor coupled between the second current node and the control node.

8. The RF switch of claim 7, wherein the transistor of the at least one of the RF switch cells comprises a first n-channel transistor having a collector coupled to the first current node, a source coupled to the second current node, and a gate coupled to the control node.

9. The RF switch of claim 7, wherein the first varactor of the at least one of the RF switch cells comprises a second n-channel transistor having a collector coupled to the first current node, a source coupled to the first current node, and a gate coupled to the control node.

10. The RF switch of claim 7, wherein the second varactor of the at least one of the RF switch cells comprises a third n-channel transistor having a collector coupled to the second current node, a source coupled to the second current node, and a gate coupled to the control node.

11. The RF switch of claim 7, wherein the at least one of the RF switch cells further comprises a resistor coupled between the first current node and the second current node.

12. The RF switch of claim 7, wherein the at least one of the RF switch cells further comprises a fourth n-channel transistor having a collector coupled to the first current node, a source coupled to the second current node, and a gate coupled to a constant voltage source.

13. The switch of claim 7, wherein a first switch cell is coupled to an RF voltage source and a last switch cell is coupled to ground.

14. The RF switch of claim 7, wherein a first RF switch cell is coupled to a first RF voltage source and a last RF switch cell is coupled to a second RF voltage source.

15. The RF switch of claim 7, wherein the transistor of a first RF switch cell has a first channel length, and the transistor of a second switch cell has a second channel length different from the first channel length.

16. The RF switch of claim 7, wherein the first current node of an Nth RF switch cell is coupled to the second current node of an (N−1)th RF switch cell, and the second current node of the Nth RF switch cell is coupled to the first current node of an (N+1)th RF switch cell.

17. The RF switch of claim 7, further comprising a driver coupled to the control node of each of the series coupled RF switch cells.

18. A method of operating an RF switch comprising a plurality of RF switch cells, at least one of the switch cells including a transistor, the method comprising:
adjusting a first capacitor coupled between a first current node of the transistor and a control node of the transistor according to a voltage across the at least one of the RF switch cells; and
adjusting a second capacitor coupled between a second current node of the transistor and the control node of the transistor according to the voltage across the at least one of the RF switch cells.

19. The method of claim 18, further comprising adjusting a resistor coupled between the first current node and the second current node of the at least one of the RF switch cells.

20. The method of claim 19, wherein adjusting the resistor comprises adjusting the resistor according to the voltage across the at least one of the RF switch cells.

* * * * *